(12) United States Patent
Chang et al.

(10) Patent No.: US 7,918,019 B2
(45) Date of Patent: Apr. 5, 2011

(54) METHOD FOR FABRICATING THIN TOUCH SENSOR PANELS

(75) Inventors: Shih Chang Chang, Cupertino, CA (US); John Z. Zhong, Cupertino, CA (US); Lili Huang, San Jose, CA (US); Seung Jae Hong, San Jose, CA (US); Lynn Youngs, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 12/351,767

(22) Filed: Jan. 9, 2009

(65) Prior Publication Data

US 2010/0175249 A1        Jul. 15, 2010

(51) Int. Cl.
*H05K 3/10* (2006.01)
(52) U.S. Cl. ............ 29/846; 29/830; 29/831; 29/842; 427/466; 427/496; 427/331; 156/247
(58) Field of Classification Search .......... 29/830, 29/831, 842, 846; 427/466, 469; 156/247
See application file for complete search history.

(56) References Cited

U.S. PATENT DOCUMENTS

| | | | |
|---|---|---|---|
| 5,483,261 A | | 1/1996 | Yasutake |
| 5,488,204 A | | 1/1996 | Mead et al. |
| 5,766,493 A | | 6/1998 | Shin |
| 5,816,225 A | | 10/1998 | Koch et al. |
| 5,825,352 A | | 10/1998 | Bisset et al. |
| 5,835,079 A | | 11/1998 | Shieh |
| 5,880,411 A | | 3/1999 | Gillespie et al. |
| 6,166,915 A | * | 12/2000 | Lake et al. .......... 361/748 |
| 6,188,391 B1 | | 2/2001 | Seely et al. |
| 6,310,610 B1 | | 10/2001 | Beaton et al. |
| 6,323,846 B1 | | 11/2001 | Westerman et al. |

(Continued)

FOREIGN PATENT DOCUMENTS

EP        1 592 073 A1        11/2005

(Continued)

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Derris H Banks
*Assistant Examiner* — Azm Parvez
(74) *Attorney, Agent, or Firm* — Morrison & Foerster LLP

(57) ABSTRACT

A method for fabricating thin DITO or SITO touch sensor panels with a thickness less than a minimum thickness tolerance of existing manufacturing equipment. In one embodiment, a sandwich of two thin glass sheets is formed such that the combined thickness of the glass sheets does not drop below the minimum thickness tolerance of existing manufacturing equipment when thin film process is performed on the surfaces of the sandwich during fabrication. The sandwich may eventually be separated to form two thin SITO/DITO panels. In another embodiment, the fabrication process involves laminating two patterned thick substrates, each having at least the minimum thickness tolerance of existing manufacturing equipment. One or both of the sides of the laminated substrates are then thinned so that when the substrates are separated, each is a thin DITO/SITO panel having a thickness less than the minimum thickness tolerance of existing manufacturing equipment.

32 Claims, 11 Drawing Sheets

U.S. PATENT DOCUMENTS

| | | |
|---|---|---|
| 6,327,011 B2 | 12/2001 | Kim |
| 6,690,387 B2 | 2/2004 | Zimmerman et al. |
| 6,955,971 B2 | 10/2005 | Ghyselen et al. |
| 7,015,894 B2 | 3/2006 | Morohoshi |
| 7,184,064 B2 | 2/2007 | Zimmerman et al. |
| 2006/0026521 A1 | 2/2006 | Hotelling et al. |
| 2006/0097991 A1 | 5/2006 | Hotelling et al. |
| 2006/0197753 A1 | 9/2006 | Hotelling |
| 2006/0292822 A1 | 12/2006 | Xie |
| 2007/0196578 A1 | 8/2007 | Karp et al. |
| 2009/0091551 A1 | 4/2009 | Hotelling et al. |

FOREIGN PATENT DOCUMENTS

| | | |
|---|---|---|
| JP | 52031757 | 3/1977 |
| JP | 05249422 | 9/1993 |
| JP | 09-312245 A | 12/1997 |
| JP | 2000-163031 A | 6/2000 |
| JP | 2002-342033 A | 11/2002 |
| WO | WO-2009/003029 A2 | 12/2008 |
| WO | WO-2010/080988 A2 | 7/2010 |
| WO | WO-2010/080988 A3 | 7/2010 |

OTHER PUBLICATIONS

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Ohkuma, Hideo; Development of a Manufacturing Process of a Thin, Lightweight LCD Cell, Department of Cell Process Development, IBM, Japan, Section 13.4 ( May 3 , 2002 ).

International Search Report mailed Jul. 21, 2010, for PCT Application No. PCT/US2010/020485, filed Jan. 8, 2010, six pages.

* cited by examiner

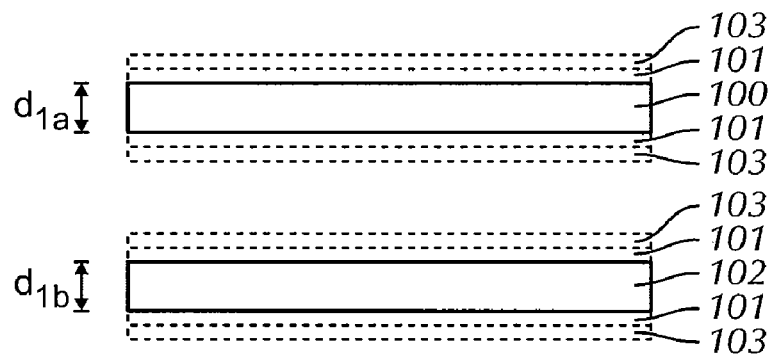
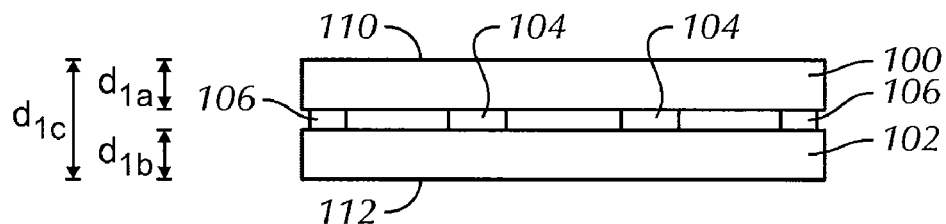
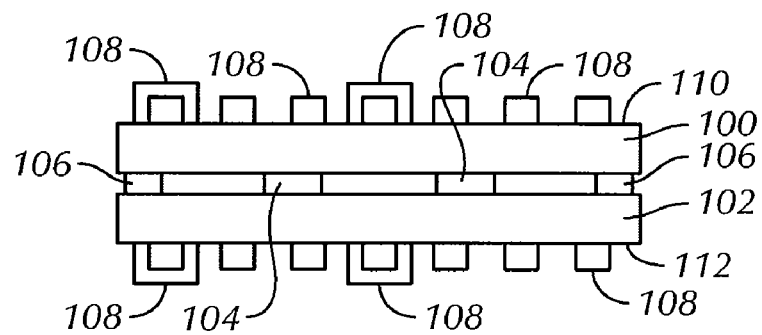
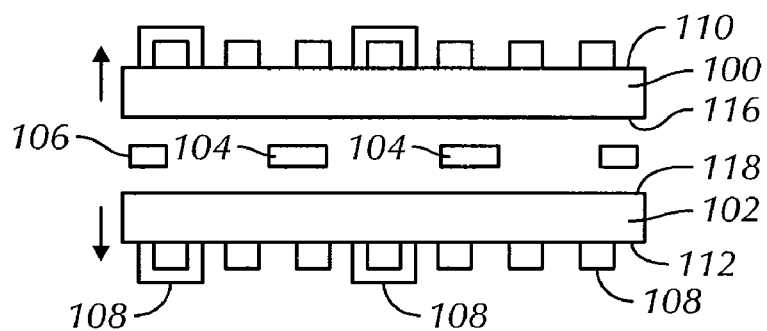

METHOD FOR FABRICATING THIN TOUCH SENSOR PANELS

FIELD OF THE INVENTION

This relates generally to the fabrication of touch sensor panels, and more particularly, to the fabrication of thin double and single sided touch sensor panels.

BACKGROUND OF THE INVENTION

In recent years, touch sensor panels, touch screens, and the like have become available as input devices. Touch screens, in particular, are becoming increasingly popular because of their ease and versatility of operation as well as their declining price. Touch screens can include a touch sensor panel, which can be a clear panel with a touch-sensitive surface, and a display device, such as an LCD panel, that can be positioned partially or fully behind the touch sensor panel so that the touch-sensitive surface can cover at least a portion of the viewable area of the display device. Touch screens can allow a user to perform various functions by touching the touch sensor panel using a finger, stylus or other object at a location dictated by a user interface (UI) being displayed by the display device. In general, touch screens can recognize a touch event and the position of the touch event on the touch sensor panel, and a computing system can then interpret the touch event in accordance with the display appearing at the time of the touch event, and thereafter can perform one or more actions based on the touch event.

Like LCD panels, touch sensor panels in touch screens may be made of glass or other suitable transparent substrate. In some configurations, touch sensor panels can be implemented as an array of pixels formed by multiple drive lines (e.g. rows) crossing over multiple sense lines (e.g. columns), where the drive and sense lines are separated by a dielectric material. In some touch sensor panels, the drive and sense lines can be formed on the top and bottom sides of the same transparent substrate. (See U.S. patent application Ser. No. 10/842,862, which is incorporated by reference in its entirety herein.) In other touch sensor panels, the drive and sense lines may be formed on one side of the transparent substrate. (See U.S. patent application Ser. No. 12/038,760, which is incorporated by reference in its entirety herein.) The sense lines and drive lines can be formed from a substantially transparent material such as Indium Tin Oxide (ITO), although other materials can also be used. The ITO layer(s) can be deposited on one or both sides of the transparent substrate. Touch sensor panels with double or single sided ITO layers are referred to as double-sided ITO (DITO) touch sensor panels and single-sided ITO (SITO) touch sensor panels, respectively, in this document.

DITO and SITO touch sensor panels are widely used in a wide-range of electronic devices, such as tablet PCs, digital music players, cellular telephones, and other wireless handheld devices. It is often desirable to use thin touch sensor panels to minimize the overall weight and thickness of these devices. Nevertheless, the thinness of a touch sensor panel is limited by the minimum thickness tolerance of existing touch sensor panel manufacturing equipment. Touch sensor panels are typically fabricated from a transparent substrate, such as glass sheets. Glass sheets that are too thin may not fit the manufacturing equipment and/or may be too fragile to withstand the rigors of the fabrication process. Most of the existing manufacturing equipment can only process glass sheets (or other similar transparent substrates) with a minimum thickness of 0.5 mm. Glass sheets that are slightly thinner than 0.5 mm may be handled by the equipment, but with limited yield and capacity. Accordingly, existing DITO/SITO touch sensor panels typically have a thickness no less than the minimum thickness tolerance of the existing touch sensor panel manufacturing equipment. Currently, the thinnest DITO/SITO touch sensor panels are about 0.5-0.55 mm thick. A method of fabricating touch sensor panels thinner than 0.5 mm using existing manufacturing equipment is desired.

SUMMARY OF THE INVENTION

This relates to methods for manufacturing thin DITO and SITO touch sensor panels. As previously mentioned, existing equipment for manufacturing SITO/DITO touch sensor panels has been designed with a minimum thickness tolerance of 0.5 mm. This is because glass sheets (or other transparent material) used to fabricate touch sensor panels need to be at least about 0.5 mm thick in order to withstand the rigors of fabrication. Thinner glass sheets may cause handling problems during the fabrication process. Nevertheless, the methods disclosed in the various embodiments of the invention allow thin DITO or SITO touch sensor panels (hereinafter referred to as "thin DITO/SITO panels") with a thickness less than 0.5 mm to be fabricated using existing manufacturing equipment. In one embodiment, a sandwich of two thin glass sheets is formed such that the combined thickness of the glass sheets does not drop below 0.5 mm when thin film process is performed on the surfaces of the sandwich during fabrication. The sandwich may eventually be separated to form two thin SITO/DITO panels. In another embodiment, a carrier substrate may be laminated to a glass sheet to form a sandwich with a thickness of at least 0.5 mm. The sandwich can be processed by existing equipment and the processed glass sheet can be separated from the sandwich to form thin SITO/DITO panel. In yet another embodiment, the fabrication process involves laminating two patterned thick substrates, each at least 0.5 mm thick. One or both of the sides of the laminated substrates are then thinned so that when the substrates are separated, each is a thin DITO/SITO panel less than 0.5 mm thick.

BRIEF DESCRIPTION OF THE DRAWINGS

FIGS. 1a-1g illustrate the exemplary steps in a DITO touch sensor panel fabrication process according to embodiments of the invention.

DETAILED DESCRIPTION OF THE PREFERRED EMBODIMENTS

Figure 1E:
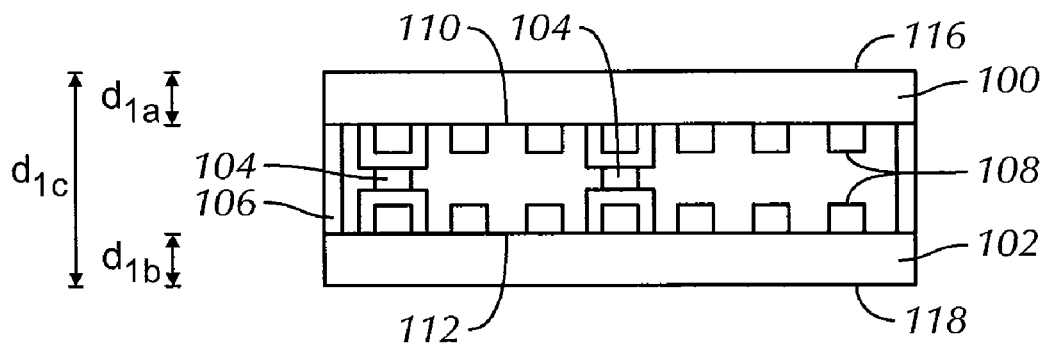

In the following description of preferred embodiments, reference is made to the accompanying drawings which form a part hereof, and in which it is shown by way of illustration specific embodiments in which the invention can be practiced. It is to be understood that other embodiments can be used and structural changes can be made without departing from the scope of the embodiments of this invention.

This relates to methods for manufacturing thin DITO and SITO touch sensor panels. As previously mentioned, existing equipment for manufacturing SITO/DITO touch sensor panels has been designed with a minimum thickness tolerance of 0.5 mm. This is because glass sheets (or other transparent material) used to fabricate touch sensor panels need to be at least about 0.5 mm thick in order to withstand the rigors of fabrication. Thinner glass sheets may cause handling problems during the fabrication process. Nevertheless, the methods disclosed in the various embodiments of the invention allow thin DITO or SITO touch sensor panels (hereinafter referred to as "thin DITO/SITO panels") with a thickness less than 0.5 mm to be fabricated using existing manufacturing equipment. In one embodiment, a sandwich of two thin glass sheets is formed such that the combined thickness of the glass sheets does not drop below 0.5 mm when thin film process is performed on the surfaces of the sandwich during fabrication. The sandwich may eventually be separated to form two thin SITO/DITO panels. In another embodiment, a carrier substrate may be laminated to a glass sheet to form a sandwich with a thickness of at least 0.5 mm. The sandwich can be processed by existing equipment and the processed glass sheet can be separated from the sandwich to form thin SITO/DITO panel. In yet another embodiment, the fabrication process involves laminating two patterned thick substrates, each at least 0.5 mm thick. One or both of the sides of the laminated substrates are then thinned so that when the substrates are separated, each is a thin DITO/SITO panel less than 0.5 mm thick.

Although embodiments of this invention are described and illustrated herein in terms of DITO/SITO panels with glass substrates, it should be understood that embodiments of this invention are not so limited to such panels and substrates, but are generally applicable to panels utilizing other touch and proximity sensing technologies, and any substrate for which thinness is required. In addition, in this specification 0.5 mm is used as the exemplary minimum thickness tolerance of existing equipment and the embodiments are described as being suitable for manufacturing DITO/SITO panels thinner than 0.5 mm. However, it should be understood that the minimum thickness tolerance of touch sensor panel manufacturing equipment may vary, and is expected to improve over time. Nevertheless, the disclosed embodiments remain valid for fabricating panels having a thickness less than the exemplary minimum thickness tolerances described herein.

Some embodiments of the invention are directed to the fabrication of thin DITO touch sensor panels (hereinafter as "DITO panels"). DITO panels are touch sensor panels having ITO patterns deposited on both surfaces. FIGS. 1a-1h illustrate the exemplary steps in a DITO panel fabrication process using existing equipment according to embodiments of the invention. Many types of material may be used to make DITO panels. For example, as illustrated in FIG. 1a, two thin glass sheets 100, 102 may be provided to fabricate two thin DITO panels. The two thin glass sheets 100, 102 may have thicknesses of $d_{1a}$ and $d_{1b}$, respectively. The two thicknesses, $d_{1a}$ and $d_{1b}$, may or may not be the same. Both $d_{1a}$ and $d_{1b}$ may be less than 0.5 mm, but the sum of $d_{1a}$ and $d_{1b}$ is at least 0.5 mm in this exemplary figure. As previously discussed, because existing touch sensor panel manufacturing equipment has a minimum thickness tolerance of 0.5 mm, the two thin glass sheets 100, 102 cannot be separately processed by the manufacturing equipment. However, when laminated together, the two thin glass sheets 100, 102 are thick enough to by processed by existing equipment.

Optionally, each of the thin glass sheets 100, 102 can be coated with a thin ITO layer 101 on both of its surfaces. In some embodiments, the coating of ITO layers is not performed until later in the fabrication process. However, because ITO deposition is typically performed at high temperature and in a vacuum, it is preferably done on individual thin glass sheet at this early stage to produce high quality ITO coatings on the thin glass sheets.

Additionally, a layer of metal coating 103 may be optionally applied on top of the ITO layer deposited on both surfaces of the thin glass sheets 100, 102. Typically, the metal coating may be also performed as a part of the thin film process in later steps. However, because the coating of the metal layer is also performed in a vacuum, it is preferably carried out on the individual thin glass sheets at this early stage of fabrication.

Referring to exemplary FIG. 1b, the pair of thin glass sheets 100, 102 may then be sealed together with separators 104 in between to form a sandwich. In particular, the thin glass sheets 100, 102 may be temporarily joined together at their edges using any known method for doing so. For example, the edges of the thin glass sheets 100, 102 may be laminated together using any known laminate 106. One or more removable separators 104 may be placed between the thin glass sheets 100, 102 to keep them apart. The separators 104 may include any material that can maintain space between the thin glass sheets 100, 102 and that does not interact with the glass sheets 100, 102. Alternatively, a removable sealant may be placed between the glass sheets 100, 102 to keep them apart. The various lamination methods described in this paragraph may be used in any lamination steps of this embodiment or other embodiments of the invention.

Referring again to FIG. 1b, because the thickness $d_{1c}$ of the sandwich is at least the combined thicknesses (i.e., $d_{1a}$ and $d_{1b}$) of the individual thin glass sheets 100, 102, the sandwich is at least 0.5 mm thick and can be routinely processed by existing touch sensor panel manufacturing equipment just like any individual glass sheet with a thickness of at least 0.5 mm.

Exemplary FIG. 1c illustrates a sandwich of two thin glass sheets 100, 102, having gone through thin film and litho/etch process on its outer surfaces 110, 112. The thin film and litho/etch process typically involves depositing one or more layers of thin films on both outer surfaces of the sandwich. The thin film layers may include an ITO layer and a metal layer. However, if the ITO layer and metal layer have already been deposited during an earlier stage before the thin glass sheets 100, 102 were laminated together, as described above, it is not necessary to perform the same depositing process again at this point. The remaining steps of the thin film and litho/etch process may still be performed to create thin film patterns 108 on both outer surfaces 110, 112 of the sandwich. The thin film patterns 108 may be used as conductive traces (e.g., sense and drive lines) for carrying signals and may include transparent materials, such as ITO. Alternatively or additionally, the thin film patterns 108 may include a metal layer including metal traces for routing signals. Alternatively or additionally, the thin film patterns 108 may be used as an anti-reflective material. Alternatively or additionally, the thin film patterns 108 may be used as a protective layer and may include ceramic material or any other material with similar protective properties.

After the thin film and litho/etch process is completed on the outer surfaces 110, 112 of the sandwich, the two thin glass sheets 100, 102 are separated from each other as illustrated in exemplary FIG. 1d. In one embodiment, the separation can be achieved by removing the sealant 106 that was used to seal the two thin glass sheets 100, 102 on their edges. In another embodiment, this can be done using any suitable chemical de-lamination method. Alternatively, the sealed edges of the substrates may be cut from the sandwich to free the two thin glass sheets 100, 102 from each other. The separators 104 may also be detached from both thin glass sheets 100, 102 as the thin glass sheets 100, 102 come apart. Other mechanical methods may also be used to separate the glass sheets 100, 102. As illustrated, each of the separated thin glass sheets 100, 102 may have thin film patterns 108 on one of its surfaces 110, 112 as a result of the thin film and litho/etch process performed in the previous step. The opposite surface 116, 118 of each glass sheet 100, 102 remains unpatterned.

Because a DITO touch sensor panel requires thin film patterns on both of its surfaces, another thin film and litho/etch process has to be performed on the unpatterned surfaces 116, 118 of the thin glass sheets 100, 102. Because the thin film patterns 108 do not significantly add to the thickness of the glass sheets 100, 102 (the figures are not drawn to scale), the thin glass sheets 100, 102 remain too thin to be handled individually by existing touch sensor panel manufacturing equipment. Therefore, to process the unpatterned surfaces 116, 118 of the thin glass sheets 100, 102, the two thin glass sheets 100, 102 have to be laminated together again to meet the minimum thickness requirement of the equipment.

Exemplary FIG. 1e illustrates the two thin glass sheets 100, 102 again laminated together with their patterned surfaces 110, 112 facing each other to form another sandwich. The unpatterned outer surfaces 116, 118 are thus the outer surfaces of the sandwich. The thin glass sheets 100, 102 may be temporarily joined together at their edges using any known method for doing so. Removable separators 104 may be placed between the patterned surfaces of the thin glass sheets 100, 102 to keep the surfaces apart. The separators 104 may include any material that can maintain space between the patterned surfaces of the glass sheets 100, 102 and that does not interact with the glass sheets 100, 102 or the patterns 108 on the surfaces 110, 112 of the glass sheets 100, 102. Alternatively, a removable sealant 106 may be placed between the patterned surfaces to keep the surfaces apart. As discussed previously, because the thickness $d_{1c}$ of the sandwich is at least the combined thicknesses (i.e., $d_{1a}+d_{1b}$) of the individual thin glass sheets 100, 102, the sandwich is at least 0.5 mm thick in this example, and can be routinely processed by existing touch sensor panel manufacturing equipment just like any individual glass sheet having a thickness of at least 0.5 mm.

Figure 1F:
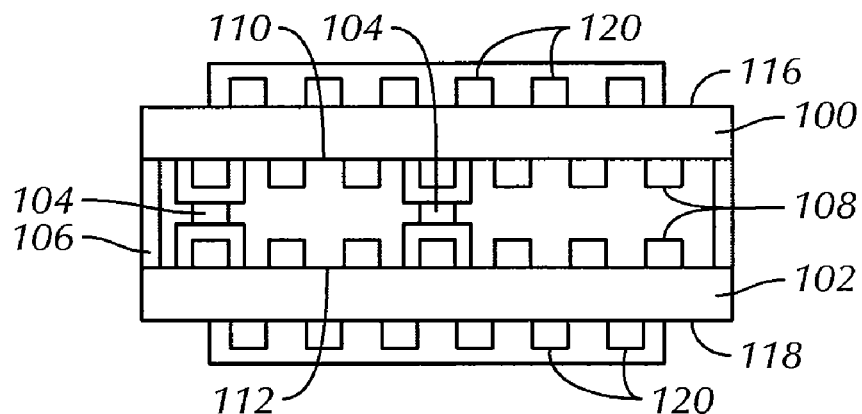
Figure 1G:
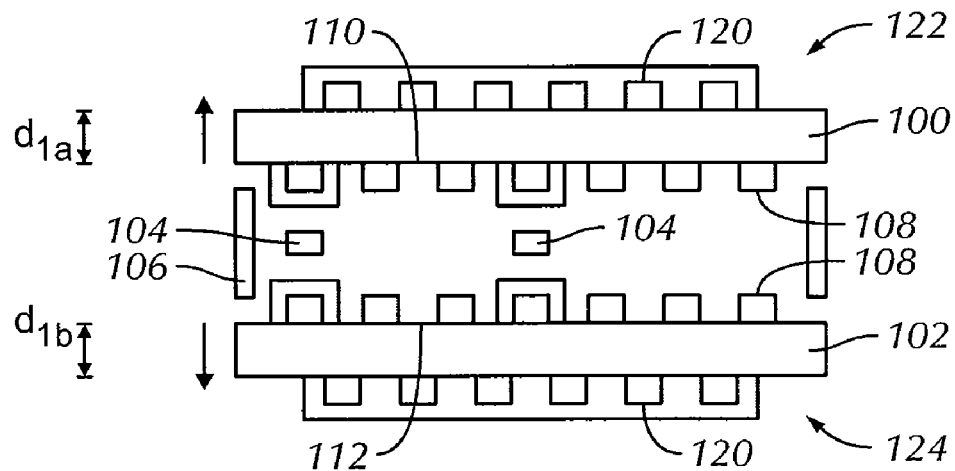

In the following step, the sandwich of laminated thin glass sheets 100, 102 may undergo another thin film and litho/etch process to add thin film patterns 120 to both unpatterned outer surfaces 116, 118 of the sandwich. Exemplary FIG. 1f illustrates a sandwich of two thin glass sheets 100, 102, each thin glass sheet having patterns on both of its surfaces. If ITO/Metal coatings have been pre-applied to the thin glass sheet surfaces, no additional coating may be needed. Otherwise, the outer surfaces 116, 118 of the sandwich may be coated with an ITO layer and, optionally, a metal layer. Thin film patterns 120 may then be created on both outer surfaces 116, 118 of the sandwich. The thin film patterns 120 may be used as conductive traces (e.g., sense and drive lines) for carrying signals and may include transparent materials, such as ITO. Alternatively or additionally, the thin film patterns 120 may include a metal layer including metal traces for routing signals. Alternatively or additionally, the thin film patterns 120 may be used as an anti-reflective material. Alternatively or additionally, the thin film patterns 120 may be used as a protective layer and may include ceramic material or any other material with similar protective properties. The type of thin film used may depend on the ultimate use of the thin DITO panels.

As a result of the second thin film and litho/etch process, each thin glass sheet 100, 102 in the sandwich may have thin film patterns 108, 120 on each of its surfaces, respectively. In essence, the sandwich now includes two DITO panels fabricated from two thin glass sheets 100, 102, laminated to each other and separated by the separators 104. In the final step, as illustrated in exemplary FIG. 1g, the sandwich is broken apart - the laminated thin glass sheets 100, 102 are separated into two individual DITO panels 122, 124. The separation can be achieved by using any suitable means including those described above in reference to FIG. 1d.

As illustrated, each of the DITO panels 122, 124 may have thin film patterns 108, 120 on both of its surfaces. Because the thin film patterns 108, 120 have thicknesses negligible relative to the thickness of the glass sheets 100, 102, the fabricated DITO panels 122, 124 can almost be as thin as the original thin glass sheets 100, 102. For example, if both of the original thin glass sheets 100, 102 are 0.3 mm thick, the DITO panels 122, 124 built from them are also about 0.3 mm thick. As such, DITO panels with thicknesses less than the minimum thickness tolerance of existing equipment can be fabricated using the existing equipment. Moreover, the throughput of the process may increase substantially because two thin DITO panels may be fabricated concurrently.

Figure 2A:
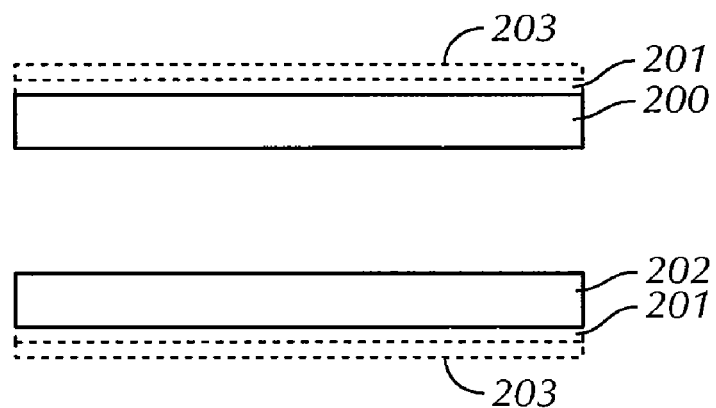
FIGS. 2a-2e illustrate the exemplary steps in a STIO touch sensor panel fabrication process according to embodiments of the invention.

FIGS. 2a-2e illustrate the exemplary steps of a thin SITO panel fabrication process according to embodiments of the invention. This process shares some of the steps of the previously disclosed DITO fabrication process. For example, two thin glass sheets 200, 202 may be provided to be used to make the SITO panels (FIG. 2a). Each of the thin glass sheets may be less than 0.5 mm thick. However, the combined thickness of the two thin glass sheets is at least 0.5 mm. The glass sheets 200, 202 may be optionally coated with a thin ITO layer 201 on one surface. In addition, a metal layer 203 may be coated on top of the ITO layer 201. Because SITO panels only require patterning on one surface, no ITO or medal coating may be necessary on the other surface of the glass sheets 200, 202.

Figure 2B:
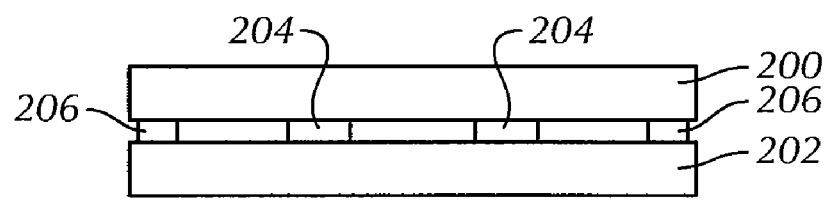

Next, the thin glass sheets 200, 202 may be laminated together to form a sandwich thick enough (e.g., at least 0.5 mm thick) to be processed by existing manufacturing equipment (FIG. 2b). If the thin glass sheets 200, 202 have each been coated with ITO/metal layers on one surface, the coated surfaces will be the outer surfaces of the sandwich. Sealing material 206 may be applied to the edges of the thin glass sheets 200, 202 to laminate the thin glass sheets together. Separators 204 may be inserted between the inner surfaces of the thin glass sheets 200, 202 to keep them from contacting each other.

Figure 2C:
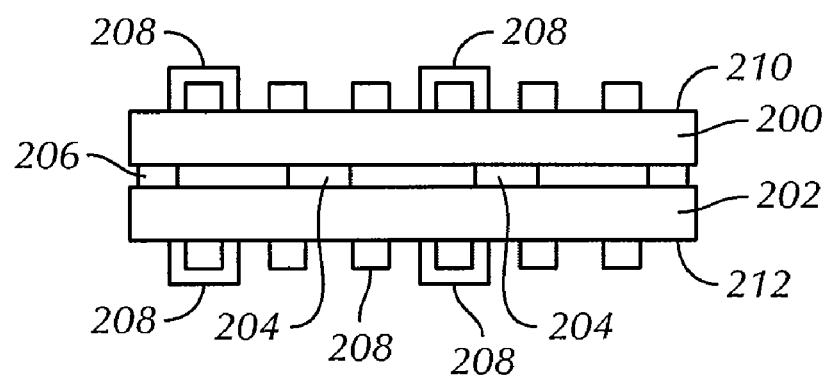

After the sandwich is formed, thin film and litho/etch process may then be performed on its outer surfaces 210, 212 to form thin film patterns 208 on the outer surfaces 210, 212 (FIG. 2c). As described in the previous DITO embodiment, the thin film patterns 208 may be used as conductive traces (e.g., sense and drive lines) for carrying signals and may include transparent materials, such as ITO. Alternatively or additionally, the thin film patterns 208 may include a metal layer including metal traces for routing signals. Alternatively or additionally, the thin film patterns 208 may be used as an anti-reflective material. Alternatively or additionally, the thin film patterns 208 may be used as a protective layer and may include ceramic material or any other material with similar protective properties. The type of thin film used may depend on the ultimate use of the thin SITO panels.

Figure 2D:
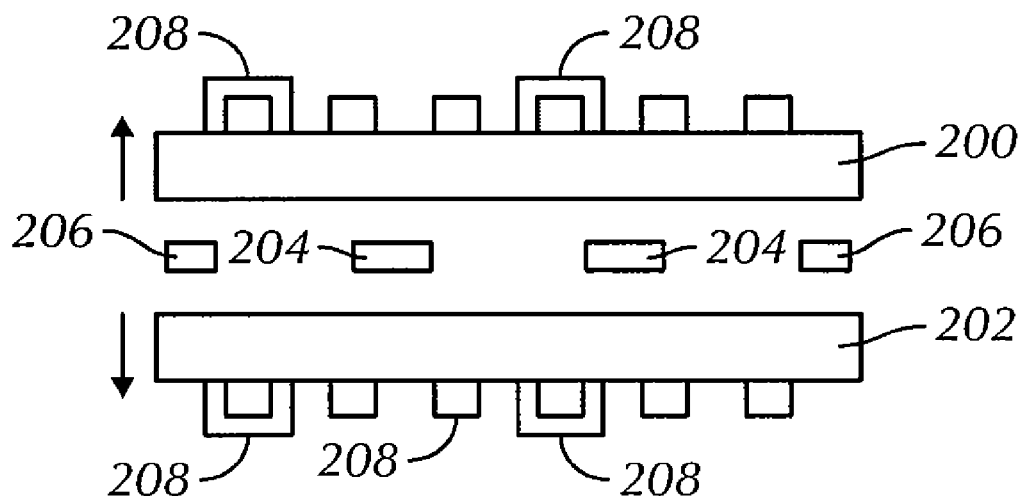

Upon completion of the thin film and litho/etch process, the sandwich may be separated to form two thin glass sheets 200, 202, each with a patterned surface (FIG. 2d). In one embodiment, the two thin glass sheets 200, 202 may be separated by removing the sealing material 206 between them. The separators 204 may also be detached from both thin glass sheets 200, 202. Once separated, each thin glass sheet 200, 202 is essentially a SITO panel.

Figure 2E:
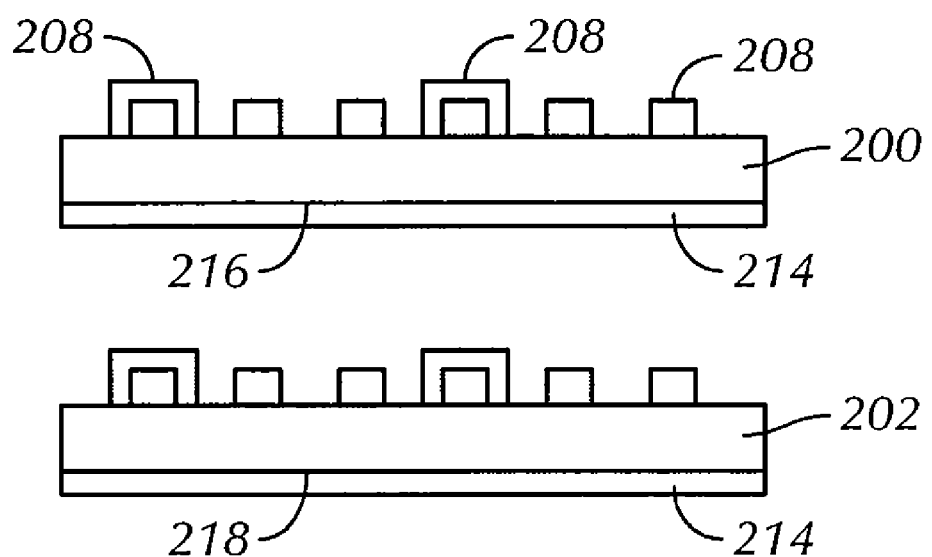

As illustrated in FIG. 2e, the unpatterned surfaces 216, 218 of glass sheets 200, 202 may be optionally coated with a layer of ITO shielding 214 at the end of the fabrication process. Other transparent material may also be used for the shielding. The shielding 214 may be used to shield signals from the display covered by the touch panel. The shielding 214 may be coated by sputtering ITO (or other transparent material) on the unpatterned surface 216, 218 of each glass sheet 200, 202. Any other known techniques may also be used to coat the shielding 214. Alternatively, the backside ITO shielding may be coated at the beginning of the fabrication before the thin glass sheets were laminated together.

Because the thin film patterns 208 and the optional ITO shielding 214 both have thicknesses negligible compared to the thickness of the individual thin glass sheets 200, 202, the fabricated SITO panels may have thicknesses about the same as the thicknesses of the original glass sheet 200, 202. For example, if both original glass sheets are 0.3 mm thick, the SITO panels built from them can also be about 0.3 mm thick. As such, SITO panels with thicknesses less than the minimum thickness tolerance of existing equipment can be fabricated using the existing equipment according to this embodiment.

In the above-described embodiments, a pair of DITO/SITO panels may be fabricated from a pair of thin glass sheets (or other transparent substrates). In other embodiments, one of the two thin glass sheets may be replaced by a carrier substrate. When laminated to the remaining thin glass sheet, the carrier substrate may provide added thickness to the thin glass sheet so that the resulting sandwich is thick enough to be processed by existing panel manufacturing equipment. Because only one glass sheet is processed, only one DITO/SITO panel can be fabricated. The carrier substrate may not be fabricated into a DITO/SITO panel.

Figure 3A:
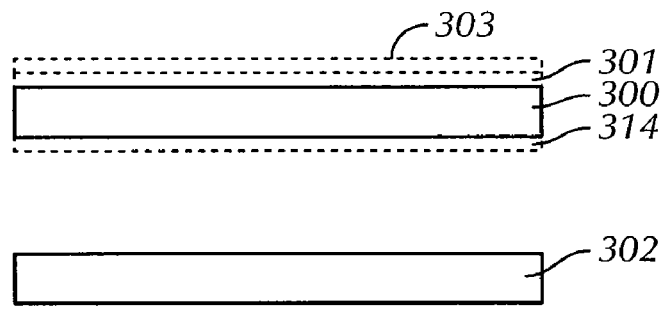
FIGS. 3a-3g illustrate the exemplary steps of a SITO/DITO touch sensor panel fabrication process according to embodiments of the invention.

FIGS. 3a-3g illustrates exemplary steps of a SITO/DITO panel fabrication process using a carrier substrate according to embodiments of the invention. As illustrated in FIG. 3a, a thin glass sheet 300 less than 0.5 mm thick may be provided for fabricating a SITO/DITO panel. As described in previous embodiments, one of the surfaces of the glass sheet 300 may be optionally coated with ITO and metal layers 301, 303. The other surface of the glass sheet 300 may be coated with a layer of ITO shielding 314 if the thin glass sheet 300 is used to fabricate a SITO panel. In addition to the thin glass sheet 300, a carrier substrate 302 may also be provided. The combined thickness of the thin glass sheet 300 and the carrier substrate 302 is at least 0.5 mm.

Figure 3B:
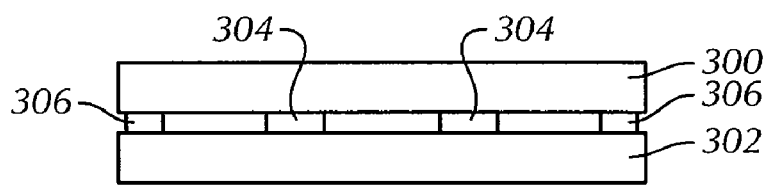

As illustrated in FIG. 3b, the thin glass sheet 300 and the carrier substrate 302 are laminated together to form a sandwich by applying sealing material 306 on their edges and having separators 304 positioned between them. The separators 304 may prevent the thin glass sheet 300 and the carrier substrate 302 from contacting each other. Although the thin glass sheet 300 by itself may not be thick enough to be processed by existing manufacturing equipment, the sandwich has a thickness no less than the combined thickness of the thin glass sheet 300 and the carrier substrate 302, which meets the minimum thickness requirement of the existing manufacturing equipment. As such, the sandwich of the thin glass sheet 300 and carrier substrate 302 may be processed by existing manufacturing equipment.

Figure 3C:
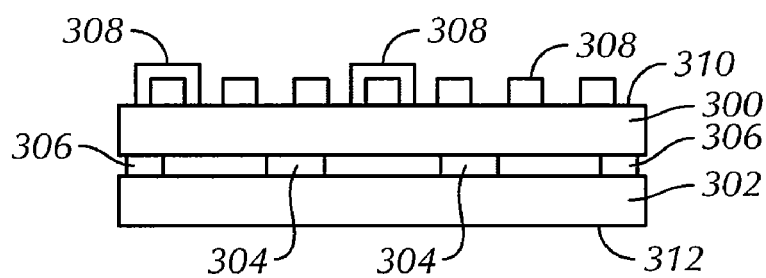

As illustrated in FIG. 3c, a thin film and litho/etch process may be performed on the sandwich to form thin film patterns 308 on the outer surface 310 of the thin glass sheet 300. As described in the previous SITO embodiment, the thin film patterns 308 may be used as conductive traces (e.g., sense and drive lines) for carrying signals and may include transparent materials, such as ITO. Alternatively or additionally, the thin film patterns 308 may include a metal layer including metal traces for routing signals. Alternatively or additionally, the thin film patterns 308 may be used as an anti-reflective material. Alternatively or additionally, the thin film patterns 308 may be used as a protective layer and may include ceramic material or any other material with similar protective properties. The type of thin film used may depend on the ultimate use of the thin SITO panels. If some of the steps in the thin film and litho/etch process such as depositing the ITO and metal layers on the outer surface 310 of the thin glass sheet 300 have already been performed before the thin glass sheet 300 was laminated to the carrier substrate 302, the same steps may not need to be repeated here. It should be noted that the thin film and litho/etch process may not result in coating or patterning of the carrier substrate 302 in this embodiment. That is, no layers or patterns are deposited on any of the surfaces 312 of the carrier substrate 302.

Figure 3D:
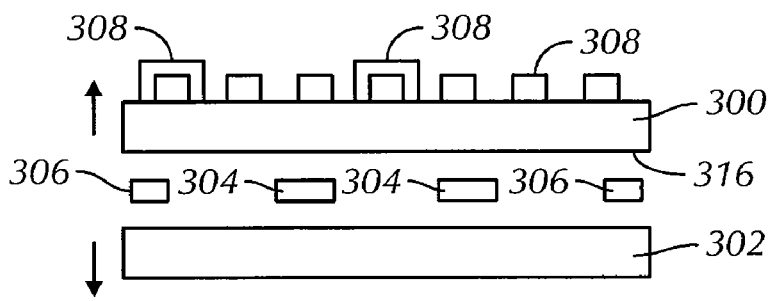

Next, as illustrated in FIG. 3d, the patterned thin glass sheet 300 is separated from the carrier substrate 302. The separated thin glass sheet 300 is essentially a SITO panel. A layer of ITO shielding (not shown) may be optionally coated on the unpatterned surface 316 of the SITO panel if it has not been done earlier in the process. One of the ways to coat the ITO shielding is by ITO sputtering. Other transparent material may also be used for the shielding. Because the thin film pattern layer 308 and the optional ITO shielding layer are relatively thin compared to the thin glass sheet 300, the thickness of the fabricated SITO panel can be about the same as that of the original thin glass sheet 300, which is less than 0.5 mm. As such, SITO panels with thicknesses less than the minimum thickness tolerance of existing equipment can be fabricated using the existing equipment according to this embodiment.

Figure 3E:
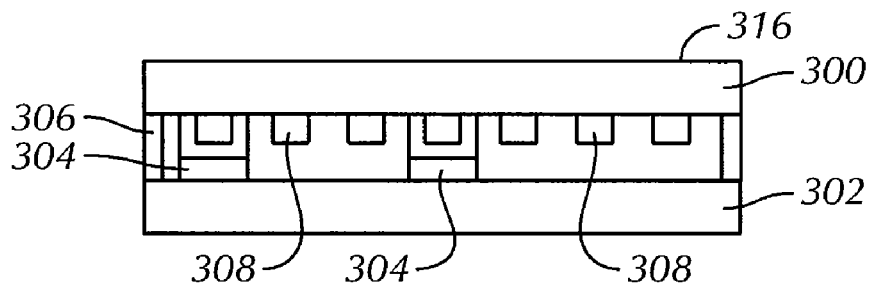

Alternatively, if the thin glass sheet 300 is to be used to fabricate a DITO panel, no ITO shielding may be coated on either surface of the thin glass sheet 300 because a DITO panel may require patterns on both of its surfaces. Accordingly, a second thin film and litho/etch process may be carried out to form thin film pattern on the unpatterned surface 316 of the thin glass sheet 300. Referring to FIG. 3e, because the thin glass sheet 300 is not thick enough to be processed by existing manufacturing equipment, a carrier substrate 302 may again be used to add thickness to the thin glass sheet 300. As illustrated, the thin glass sheet 300 and the carrier substrate 302 are laminated together to form a sandwich with the patterned surface of the thin glass sheet 300 facing the carrier substrate 302. That is, the unpatterned surface 316 of the thin glass sheet 300 is now the outer surface of the sandwich. The sandwich may be sealed by sealing material 306 on the edges between the thin glass sheet 300 and the carrier substrate 302. Separators 304 are positioned between the thin glass sheet 300 and the carrier substrate 302 to prevent them from contacting each other.

Figure 3F:
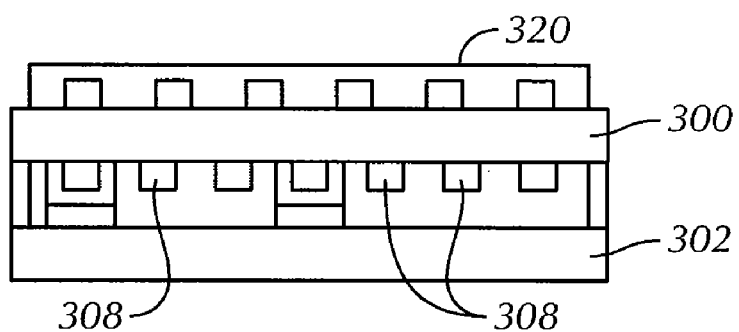

Because the laminated thin glass sheet 300 and the carrier substrate 302 have a combined thickness no less than 0.5 mm, thin film and litho/etch process can be performed on the sandwich using existing manufacturing equipment. As illustrated in FIG. 3f, at least one layer of thin film pattern 320 may be formed on the outer surface 316 of the thin glass substrate 300. If ITO/Metal layers have already been deposited on the glass sheet surfaces, no additional coating may need to be performed. Otherwise, thin film layers and/or patterns 320 may be deposited on the outer surface 316 of the thin glass sheet 300. The thin film patterns 320 may be used as conductive traces (e.g., sense and drive lines) for carrying signals and may include transparent materials, such as ITO. Alternatively or additionally, the thin film patterns 320 may include a metal layer including metal traces for routing signals. Alternatively or additionally, the thin film patterns 320 may be used as an anti-reflective material. Alternatively or additionally, the thin film patterns 320 may be used as a protective layer and may include ceramic material or any other material with similar protective properties. The type of thin film used may depend on the ultimate use of the thin DITO panels. It should be noted that the carrier substrate may remain unprocessed and unpatterned in this thin film and litho/etch process.

Figure 3G:
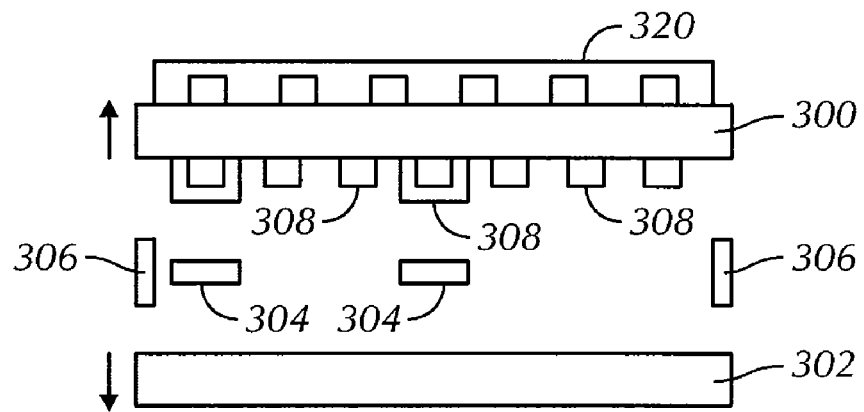

Finally, as illustrated in FIG. 3g, the thin glass sheet 300 with thin film patterns 308, 320 on both of its surfaces may be separated from the carrier substrate 302 to form a thin DITO panel. Because the layers of thin film patterns do not add much to the thickness to the panel, the thin DITO panel can potentially be as thin as the original glass sheet, less than 0.5 mm thick. Accordingly, DITO panels with thicknesses less than the minimum thickness tolerance of existing equipment can be fabricated using the existing equipment according to this embodiment.

Figure 4A:
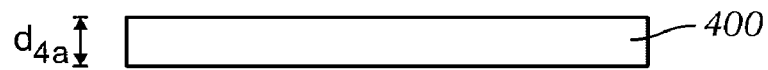
FIGS. 4a-4g illustrate the exemplary steps of another SITO/DITO touch sensor panel fabrication process according to embodiments of the invention.
Figure 4A:
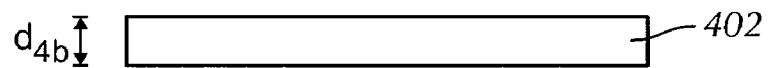

FIGS. 4a-4g illustrates the exemplary steps in a thin DITO/SITO panel fabrication process according to another embodiment of the invention. Instead of using a pair of thin substrates, such as a pair of thin glass sheets, to fabricate thin DITO/SITO panels as described in some of the previous embodiments, a pair of thick substrates are used in this embodiment to fabricate thin DITO/SITO panels. As illustrated in FIG. 4a, the thick substrates may be glass sheets 400, 402 with thicknesses $d_{4a}$ and $d_{4b}$, respectively. Each of $d_{4a}$ and $d_{4b}$ is at least 0.5 mm so that each of the glass sheets 400, 402 can be handled and processed by existing DITO/SITO panel manufacturing equipment. Thicknesses $d_{4a}$ and $d_{4b}$ may or may not be the same.

Figure 4B:
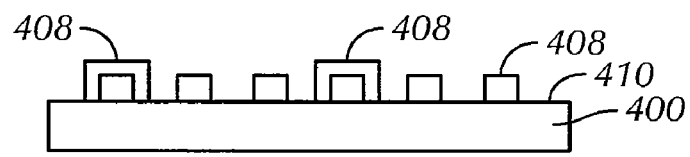
Figure 4B:
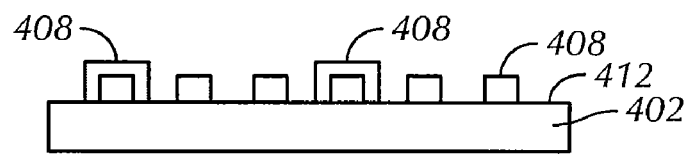

Referring to FIG. 4b, because the thick glass sheets 400, 402 are thick enough to be processed by existing DITO/SITO panel manufacturing equipment, each thick glass sheet 400, 402 may individually undergo thin film and litho/etch processing to have thin film patterns 408 deposited on one of its surfaces 410, 412. As described in other embodiments, the thin film patterns 408 may be used as conductive traces (e.g., sense and drive lines) for carrying signals and may include transparent materials, such as ITO. Alternatively or additionally, the thin film patterns 408 may include a metal layer including metal traces for routing signals. Alternatively or additionally, the thin film patterns 408 may be used as an anti-reflective material. Alternatively or additionally, the thin film patterns 408 may be used as a protective layer and may include ceramic material or any other material with similar protective properties. The type of thin film used may depend on the ultimate use of the thin DITO/SITO panels.

Figure 4C:
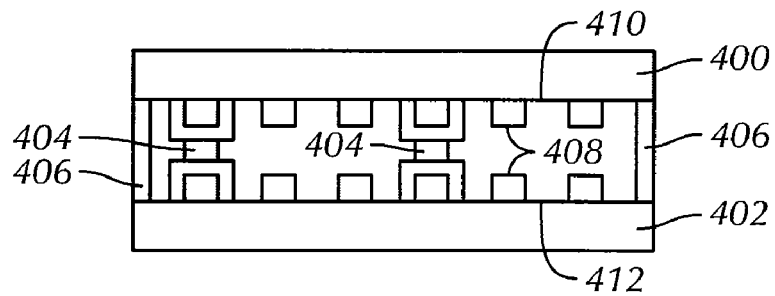

Referring now to FIG. 4c, the pair of patterned thick glass sheets 400, 402 may then be sealed together to form a sandwich with their patterned surfaces 410, 412 facing each other and separators 404 between the patterned surfaces 410, 412. In the example of FIG. 4c, the thick glass sheets 400, 402 may be temporarily joined together at their edges using sealing material 406. One or more removable separators 404 may be placed between the patterned surfaces 410, 412 of the thick glass sheets 400, 402 to keep the surfaces from contacting each other.

Figure 4D:
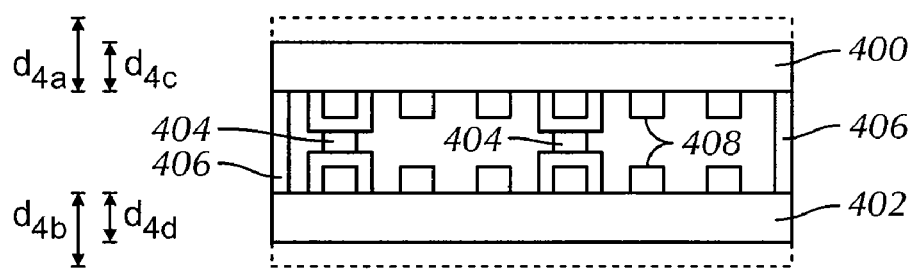

FIG. 4d illustrates the sandwich of patterned thick glass sheets 400, 402 having been thinned on outside surfaces according to embodiments of the invention. In the example of FIG. 4d, thick glass sheets 400 and 402 of FIG. 4c that are sandwiched together may be thinned from respective thicknesses of $d_{4a}$ and $d_{4b}$ to thicknesses of $d_{4c}$ and $d_{4d}$, where $d_{4c}<d_{4a}$ and $d_{4d}<d_{4b}$. For example, the thick glass sheets each having thicknesses of 0.5 mm or more may be thinned to thicknesses of less than 0.5 mm each. The thinning process may include chemical etching, mechanical polishing, a combination of the two, and any other known methods for thinning glass sheets. One or both outside surfaces of the sandwich, i.e., the surfaces of glass sheets 400 and 402 opposite the patterned surfaces, may be thinned. Since patterns 480 may be sealed within the sandwich on inside surfaces, the patterns 480 may be protected from deformation or damage during the thinning process. As a result of the thinning process, each glass sheet 400 and 402 can have a thickness less than 0.5 mm; while the sandwich of the thinned glass sheets 400, 402 maintains an overall thickness at or above 0.5 mm.

Figure 4E:
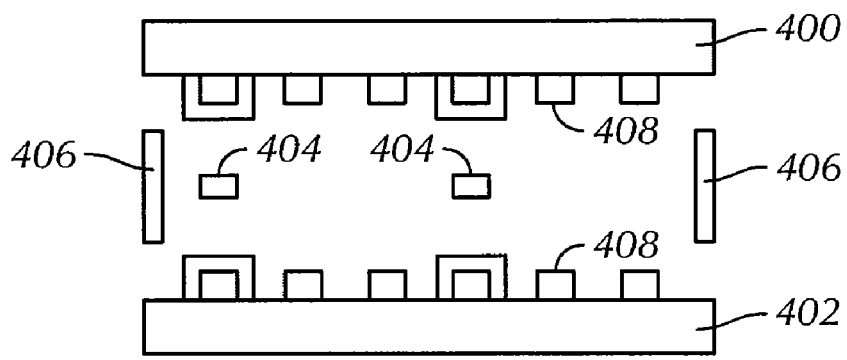

Referring to FIG. 4e, if the panels to be fabricated from the glass sheets 400, 402 are SITO panels, the sandwich may be separated to form separate glass sheets 400, 402, each with thin film patterns 408 on one of its surfaces. Optionally, ITO sputtering may be performed on the opposite unpatterned surfaces of the thin glass sheets 400, 402 to create a layer of ITO shielding, as described in the previous embodiments. The separated glass sheets 400, 402 are SITO panels each having a thickness of less than 0.5 mm as a result of the thinning process. As such, thin SITO panels can be fabricated from thick glass sheets using existing equipment according to this embodiment of the invention.

Figure 4F:
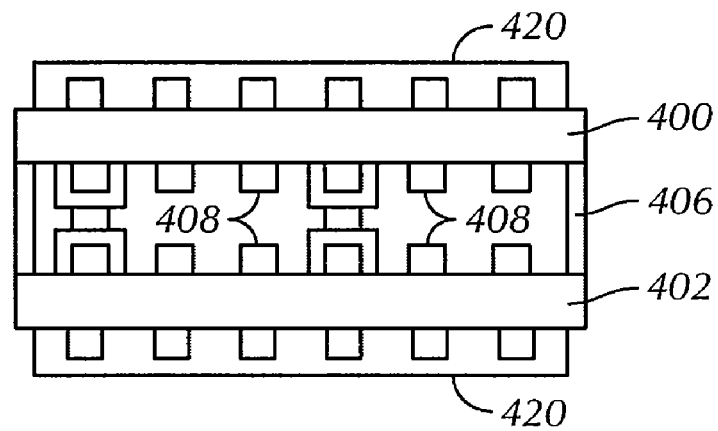

Alternatively, if the panels to be fabricated are DITO panels, the thinned outside surfaces of the sandwich of FIG. 4d also have to be coated with thin film layers/patterns. Skipping the step illustrated in FIG. 4e and referring to FIG. 4f, while the sandwich of thinned glass sheets 400, 402 remain laminated, thin film and litho/etch processing may be performed on the thinned outer surfaces of the sandwich. The thin film and litho/etch process may be the same process described in the previous embodiments. As a result of the process, thin film patterns 420 may be coated on the thinned outer surfaces of the sandwich. As illustrated in FIG. 4f, the sandwich at this stage may include two thin glass sheets 400, 402, each with two patterned surfaces.

Figure 4G:
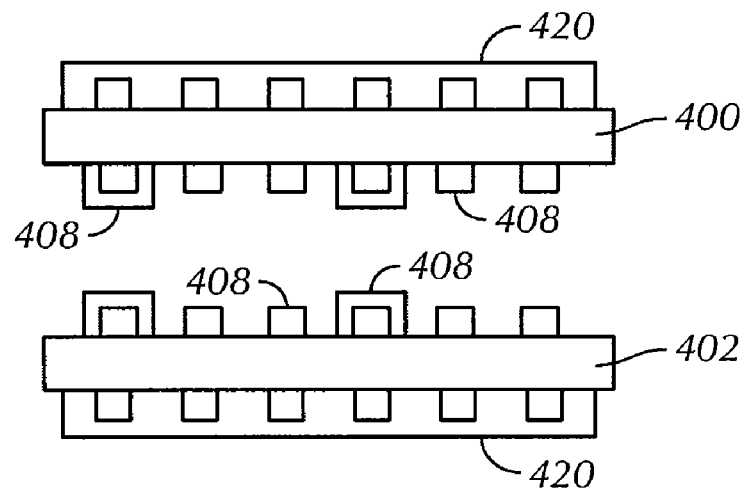

Referring to FIG. 4g, the sandwich is then separated into a pair of thin glass sheets 400, 402, each of which may be a DITO panel. Each DITO panels may have a thickness less than 0.5 mm. As such, thin DITO panels can be fabricated from thick glass sheets using existing equipment according to this embodiment of the invention. Moreover, for the pairs of sheets, the throughput may increase substantially because two sheets may be processed at once during part of the fabrication process.

Figure 5A:
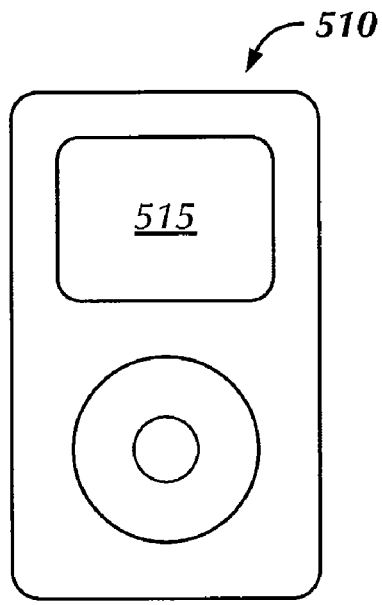
FIG. 5a illustrates an exemplary digital media player having a SITO or DITO touch sensor panel fabricated according to embodiments of the invention.

FIG. 5a illustrates exemplary digital media player 510 that can include thin touch sensor panel 515, the thin touch sensor panel having a thickness of less than 0.5 mm and fabricated according to embodiments of the invention.

Figure 5B:
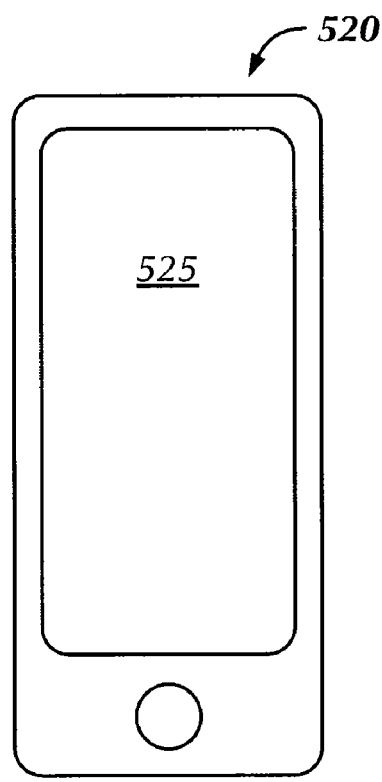
FIG. 5b illustrates an exemplary mobile telephone having a SITO or DITO touch sensor panel fabricated according to embodiments of the invention.

FIG. 5b illustrates exemplary mobile telephone 520 that can include thin touch sensor panel 525, the thin touch sensor panel having a thickness of less than 0.5 mm and fabricated according to embodiments of the invention.

Figure 5C:
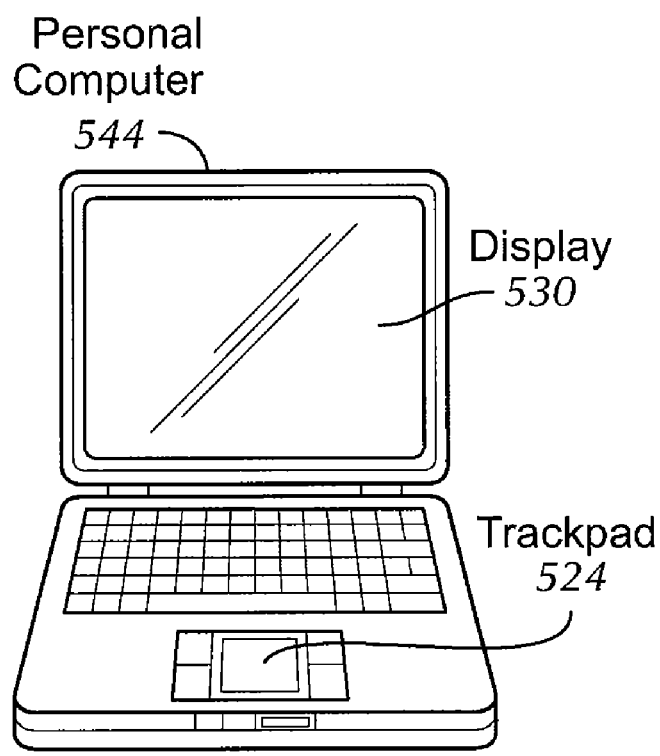
FIG. 5c illustrates an exemplary mobile computer having a SITO or DITO touch sensor panel fabricated according to embodiments of the invention.

FIG. 5c illustrates an exemplary personal computer 544 that can include touch sensor panel 524 and display device 530. The touch sensor panel 524 can be a SITO/DITO panel fabricated according to embodiments of the invention. The display device 530 can also include a SITO/DITO panel fabricated according to embodiments of the invention.

Figure 5D:
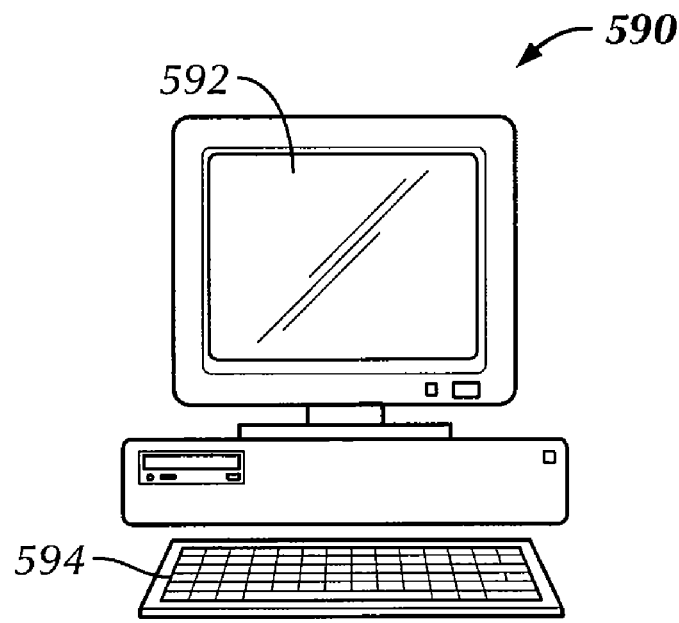
FIG. 5d illustrates an exemplary desktop computer having a SITO or DITO touch sensor panel fabricated according to embodiments of the invention.

FIG. 5d illustrates a desktop computer 590 including a display device 592. The display device 592 may include a SITO/DITO panel fabricated according to embodiments of the invention. The desktop computer 590 may also include a virtual keyboard 594 which incorporates a SITO/DITO panel fabricated according to embodiments of the invention.

The devices (or parts of the devices) of FIGS. 5a-5d can achieve lighter weights utilizing thin DITO/SITO panels fabricated according to embodiments of the invention.

Figure 6:
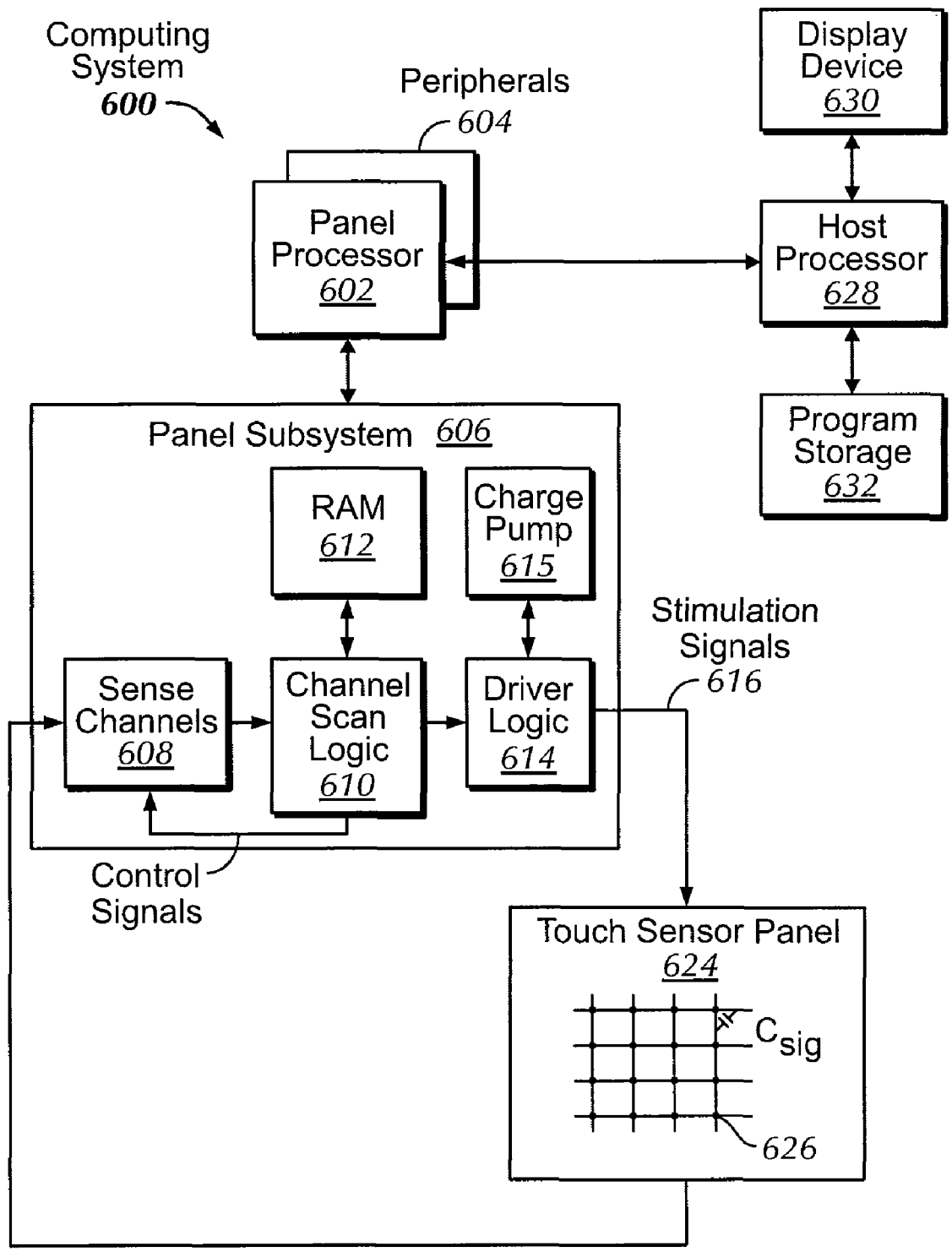
FIG. 6 illustrates an exemplary computing system including a touch sensor panel fabricated according to embodiments of the invention.

FIG. 6 illustrates exemplary computing system 600 that can include one or more DITO or SITO touch sensor panels fabricated according to the embodiments of the invention described above. Computing system 600 can include one or more panel processors 602 and peripherals 604, and panel subsystem 606. Peripherals 604 can include, but are not limited to, random access memory (RAM) or other types of memory or storage, watchdog timers and the like. Panel subsystem 606 can include, but is not limited to, one or more sense channels 608, channel scan logic 610 and driver logic 614. Channel scan logic 610 can access RAM 612, autonomously read data from the sense channels and provide control for the sense channels. In addition, channel scan logic 610 can control driver logic 614 to generate stimulation signals 616 at various frequencies and phases that can be selectively applied to drive lines of touch sensor panel 624. In some embodiments, panel subsystem 606, panel processor 602 and peripherals 604 can be integrated into a single application specific integrated circuit (ASIC).

Touch sensor panel 624 can include a capacitive sensing medium having a plurality of drive lines and a plurality of sense lines, although other sensing media can also be used. Either or both of the drive and sense lines can be coupled to a thin glass sheet according to embodiments of the invention. Each intersection of drive and sense lines can represent a capacitive sensing node and can be viewed as picture element (pixel) 626, which can be particularly useful when touch sensor panel 624 is viewed as capturing an "image" of touch. (In other words, after panel subsystem 606 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) Each sense line of touch sensor panel 624 can drive sense channel 608 (also referred to herein as an event detection and demodulation circuit) in panel subsystem 606.

Computing system 600 can also include host processor 628 for receiving outputs from panel processor 602 and performing actions based on the outputs that can include, but are not limited to, moving an object such as a cursor or pointer, scrolling or panning, adjusting control settings, opening a file or document, viewing a menu, making a selection, executing instructions, operating a peripheral device coupled to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 628 can also perform additional functions that may not be related to panel processing, and can be coupled to program storage 632 and display device 630 such as an LCD panel for providing a UI to a user of the device. Display device 630 together with touch sensor panel 624, when located partially or entirely under the touch sensor panel, can form touch screen 618.

Note that one or more of the functions described above can be performed by firmware stored in memory (e.g. one of the peripherals 604 in FIG. 6) and executed by panel processor 602, or stored in program storage 632 and executed by host processor 628. The firmware can also be stored and/or transported within any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any medium that can contain or store the program for use by or in connection with the instruction execution system, apparatus, or device. The computer readable medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport readable medium can include, but is not limited to, an electronic, magnetic, optical, electromagnetic or infrared wired or wireless propagation medium.

Although embodiments of this invention have been fully described with reference to the accompanying drawings, it is to be noted that various changes and modifications will become apparent to those skilled in the art. Such changes and modifications are to be understood as being included within the scope of embodiments of this invention as defined by the appended claims.

What is claimed is:

1. A method for fabricating a thin printed circuit, comprising:
   providing a first substrate having a first thickness, a first surface, and a second surface;
   providing a second substrate having a second thickness, a third surface, and a fourth surface;
   joining the first and second substrates together to form a first sandwich, the first surface of the first substrate being a first outer surface of the first sandwich and the third surface of the second glass sheet being a second outer surface of the first sandwich;

forming thin film patterns on the first outer surface of the first sandwich;
    forming thin film patterns on the second outer surface of the first sandwich; and
    separating the first and second substrates of the first sandwich from each other.

2. The method of claim 1, wherein the first substrate is a first glass sheet and the second substrate is a second glass sheet.

3. The method of claim 2, further comprising:
    coating each of the second surface and the fourth surface with a layer of shielding.

4. The method of claim 3, wherein coating is performed before the first glass sheet and the second sheet are joined together.

5. The method of claim 3, wherein the layer of shielding is ITO.

6. The method of claim 2, further comprising:
    coating an ITO layer on each of the first surface and the third surface before the first glass sheet and the second glass sheet are joined together.

7. The method of claim 6, further comprising:
    coating a metal layer on top of the ITO layers on the first surface and the third surface before the first glass sheet and the second glass sheet are joined together.

8. The method of claim 2, wherein neither the first glass sheet nor the second glass sheet has a thickness greater than a minimum thickness tolerance of existing touch sensor panel manufacturing equipment, and wherein the combined thickness of the first glass sheet and the second glass sheet is at least greater than the minimum thickness tolerance.

9. The method of claim 2, wherein joining comprises sealing the edges of the first glass sheet and the second glass sheet together.

10. The method of claim 9, wherein separating comprises unsealing sealed-together edges of the first glass sheet and the second glass sheet.

11. The method of claim 2, wherein joining comprises inserting at least one separator between the first glass sheet and the second glass sheet to prevent the first glass sheet and the second glass sheet from contacting each other.

12. The method of claim 11, wherein separating comprises detaching the separators from the first glass sheet and the second glass sheet.

13. The method of claim 2, further comprising:
    joining the first glass sheet and the second glass sheet together to form a second sandwich, the second surface and the fourth surface being outer surfaces of the second sandwich, respectively;
    forming thin film patterns on the outer surfaces of the second sandwich; and
    separating the first glass sheet and the second glass sheet of the second sandwich from each other.

14. The method of claim 13, further comprising:
    coating an ITO layer on both surfaces of the first glass sheet and the second glass sheet before the first glass sheet and the second glass sheet are joined together to form the first sandwich.

15. The method of claim 14, further comprising:
    coating a metal layer on top of the ITO layers on both surfaces of the first glass sheet and the second glass sheet before the first glass sheet and the second glass sheet are jointed together to form the first sandwich.

16. The method of claim 13, wherein neither the first glass sheet nor the second glass sheet has a thickness greater than a minimum thickness tolerance of existing touch sensor panel manufacturing equipment, and wherein the combined thickness of the first glass sheet and the second glass sheet is at least the minimum thickness tolerance.

17. The method of claim 1, wherein the first substrate is a first glass sheet, and the second substrate is a carrier substrate.

18. The method of claim 17, further comprising:
    coating the second surface of the first glass sheet with a layer of shielding.

19. The method of claim 18, wherein coating is performed before the first glass sheet and the carrier substrate are joined together.

20. The method of claim 19, wherein the layer of shielding is ITO.

21. The method of claim 17, further comprising:
    coating an ITO layer on the first surface of the first glass sheet before the first glass sheet and the carrier substrate are joined together.

22. The method of claim 21, further comprising:
    coating a metal layer on top of the ITO layers on the first surface of the first glass sheet before the first glass sheet and the carrier substrate are joined together.

23. The method of claim 17, wherein the first glass sheet has a thickness less than a minimum thickness tolerance of existing touch sensor panel manufacturing equipment, and wherein the combined thickness of the first glass sheet and the carrier substrate is at least the minimum thickness tolerance.

24. The method of claim 17, wherein joining comprises sealing the edges of the first glass sheet and the carrier substrate together.

25. The method of claim 24, wherein separating comprises unsealing sealed-together edges of the first glass sheet and the carrier substrate.

26. The method of claim 17, wherein joining comprises inserting at least one separator between the first glass sheet and the carrier substrate to prevent the first glass sheet and the carrier substrate from contacting each other.

27. The method of claim 26, wherein separating comprises detaching the separators from the first glass sheet and the carrier substrate.

28. The method of claim 17, further comprising:
    joining the first glass sheet and the carrier substrate together to form a second sandwich, the second surface of the first glass sheet being an outer surface of the second sandwich;
    forming thin film patterns on the outer surface of the second sandwich, the outer surface is the second surface of the first glass sheet; and
    separating the first glass sheet and the carrier substrate of the second sandwich from each other.

29. The method of claim 28, further comprising:
    coating an ITO layer on both surfaces of the first glass sheet before the first glass sheet and the carrier substrate are joined together to form the first sandwich.

30. The method of claim 29, further comprising:
    coating a metal layer on top of the ITO layers on both surfaces of the first glass sheet before the first glass sheet and the carrier substrate are joined together to form the first sandwich.

31. The method of claim 28, wherein the first glass sheet has a thickness less than a minimum thickness tolerance of existing touch sensor panel manufacturing equipment, and wherein the combined thickness of the first glass sheet and the carrier substrate is at least the minimum thickness tolerance.

32. The method of claim 1 further comprising:
    providing at least one separator between the first and second substrates.

* * * * *

UNITED STATES PATENT AND TRADEMARK OFFICE
CERTIFICATE OF CORRECTION

PATENT NO. : 7,918,019 B2  Page 1 of 1
APPLICATION NO. : 12/351767
DATED : April 5, 2011
INVENTOR(S) : Shih Chang Chang et al.

It is certified that error appears in the above-identified patent and that said Letters Patent is hereby corrected as shown below:

In column 13, line 60, in Claim 15, delete "jointed" and insert -- joined --, therefor.

Signed and Sealed this
Twenty-second Day of November, 2011

David J. Kappos
*Director of the United States Patent and Trademark Office*

UNITED STATES PATENT AND TRADEMARK OFFICE
CERTIFICATE OF CORRECTION

PATENT NO. : 7,918,019 B2  Page 1 of 1
APPLICATION NO. : 12/351767
DATED : April 5, 2011
INVENTOR(S) : Shih Chang Chang et al.

It is certified that error appears in the above-identified patent and that said Letters Patent is hereby corrected as shown below:

Column 12, line number 66, Claim 1, delete "glass sheet" and insert -- substrate -- therefor.

Signed and Sealed this
Twenty-fourth Day of July, 2012

David J. Kappos
*Director of the United States Patent and Trademark Office*